United States Patent
Lee et al.

(10) Patent No.: US 8,609,549 B2
(45) Date of Patent: Dec. 17, 2013

(54) PLASMA ETCHING METHOD, PLASMA ETCHING APPARATUS, AND COMPUTER-READABLE STORAGE MEDIUM

(75) Inventors: Sungtae Lee, Kofu (JP); Masahiro Ogasawara, Nirasaki (JP); Junichi Sasaki, Hwaseng (KR); Naohito Yanagida, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 211 days.

(21) Appl. No.: 13/045,988

(22) Filed: Mar. 11, 2011

(65) Prior Publication Data

US 2011/0250761 A1    Oct. 13, 2011

Related U.S. Application Data

(60) Provisional application No. 61/318,637, filed on Mar. 29, 2010.

(30) Foreign Application Priority Data

Mar. 12, 2010    (JP) ................................ 2010-055896

(51) Int. Cl.
*H01L 21/302* (2006.01)
*H01L 21/461* (2006.01)

(52) U.S. Cl.
USPC ........... 438/717; 438/710; 438/694; 438/786; 257/E21.218

(58) Field of Classification Search
USPC ........... 438/717, 710, 694, 786; 257/E21.218
See application file for complete search history.

(56) References Cited

U.S. PATENT DOCUMENTS

| | | |
|---|---|---|
| 2003/0219973 A1 | 11/2003 | Townsend, III et al. |
| 2006/0066247 A1* | 3/2006 | Koshiishi et al. ........ 315/111.21 |
| 2008/0014755 A1 | 1/2008 | Wada et al. |
| 2008/0132085 A1* | 6/2008 | Luo et al. ....................... 438/786 |
| 2009/0068842 A1* | 3/2009 | Kim ............................. 438/694 |
| 2010/0323525 A1* | 12/2010 | Chi et al. ....................... 438/710 |

FOREIGN PATENT DOCUMENTS

| | | |
|---|---|---|
| CN | 1220483 A | 6/1999 |
| CN | 1647263 A | 7/2005 |
| CN | 101320706 A | 12/2008 |
| JP | 2008-21791 | 1/2008 |
| WO | 2010/024037 A1 | 3/2010 |

* cited by examiner

*Primary Examiner* — Duy Deo
*Assistant Examiner* — Mahmoud Dahimene
(74) *Attorney, Agent, or Firm* — Rothwell, Figg, Ernst & Manbeck, P.C.

(57) ABSTRACT

A plasma etching method is provided to perform a plasma etching on a silicon oxide film or a silicon nitride film formed below an amorphous carbon film by using a pattern of the amorphous carbon film as a final mask in a multilayer mask including a photoresist layer having a predetermined pattern, an organic bottom anti-reflection coating (BARC) film formed below the photoresist layer, an SiON film formed below the BARC film, and the amorphous carbon film formed below the SiON film. An initial mask used at the time when the plasma etching of the silicon oxide film or the silicon nitride film is started is under a state in which the SiON film remains on the amorphous carbon film and a ratio of a film thickness of the amorphous carbon film to a film thickness of the residual SiON film is smaller than or equal to about 14.

12 Claims, 6 Drawing Sheets

*FIG.3A* *FIG.3B*
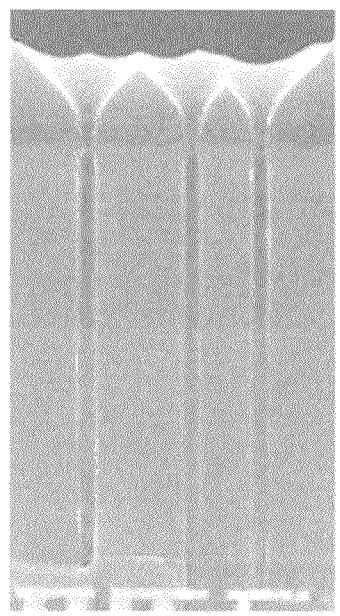 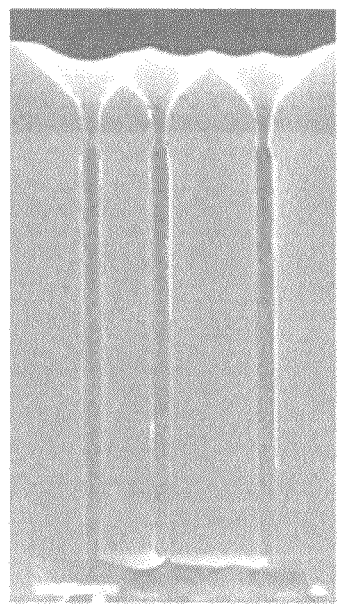
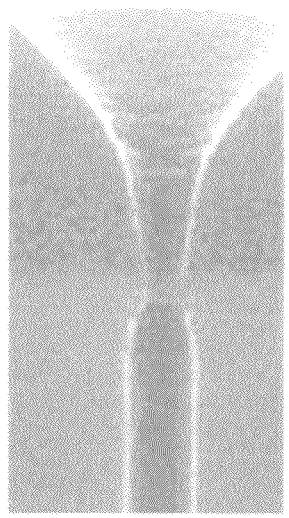 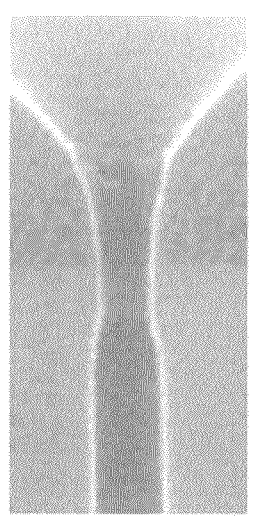

*FIG.4A*  *FIG.4B*
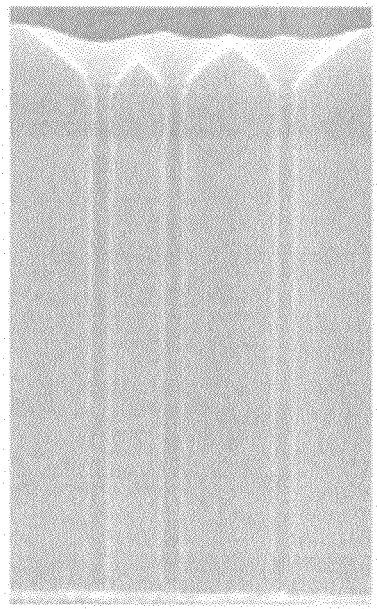 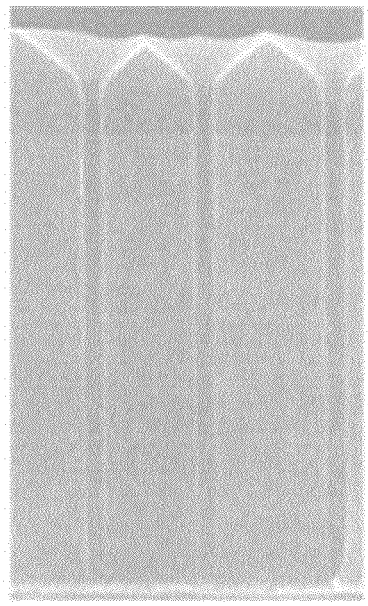
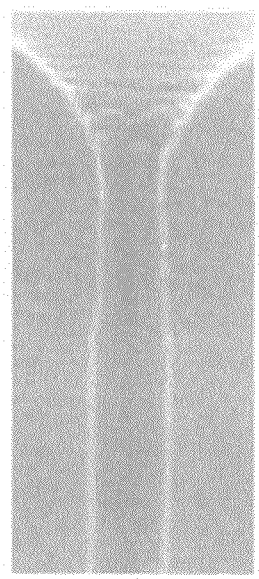 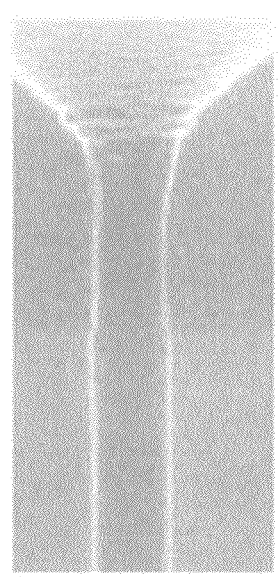

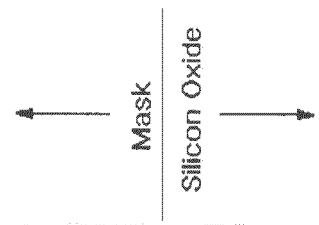
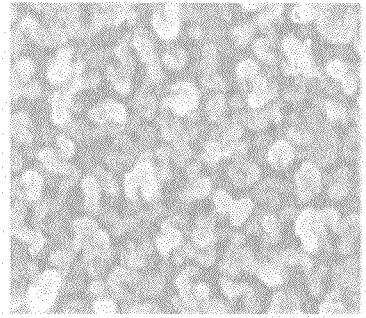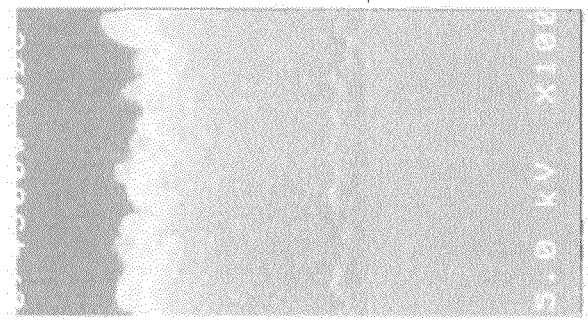
FIG.6A
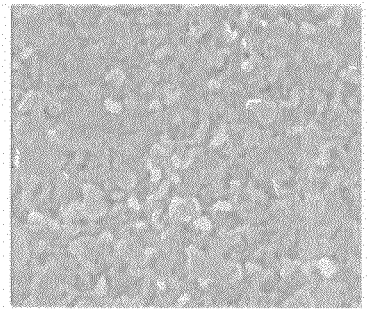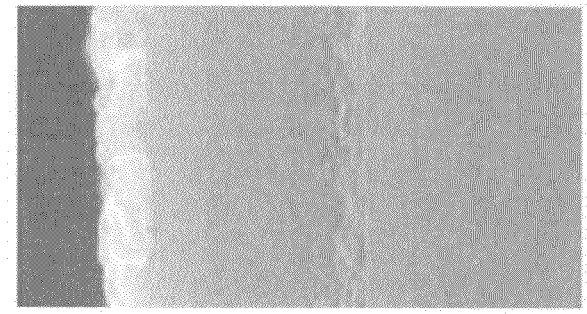
FIG.6B
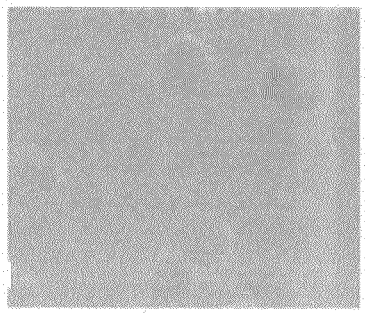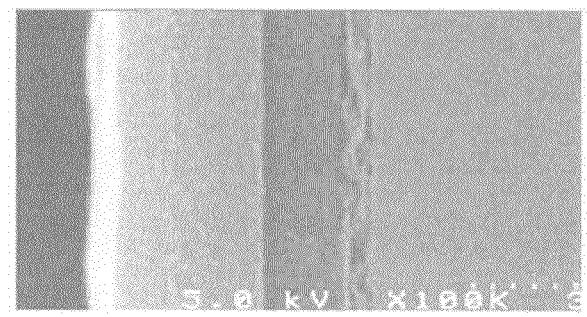
FIG.6C

PLASMA ETCHING METHOD, PLASMA ETCHING APPARATUS, AND COMPUTER-READABLE STORAGE MEDIUM

FIELD OF THE INVENTION

The present invention relates to a plasma etching method, a plasma etching apparatus and a computer-readable storage medium.

BACKGROUND OF THE INVENTION

In a conventional semiconductor device manufacturing process, a plasma etching process is performed by using, e.g., a photoresist or the like as a mask, to thereby form an etching target film such as a silicon oxide film or the like in a desired pattern. As for the plasma etching apparatus, there is known, e.g., a capacitively coupled plasma etching apparatus for generating a plasma by applying a RF (radio frequency) power between a lower electrode also serving as a mounting table for mounting thereon a substrate such as a semiconductor wafer and an upper electrode disposed to face the lower electrode.

In such plasma etching for forming a hole in an insulating film such as a silicon oxide film, a silicon nitride film or the like, a film thickness of a mask tends to be decreased while the depth of the hole is increased, so that it is difficult to obtain a vertical hole shape.

Thus, various developments are being made in order to obtain desired opening characteristics and selectivity in the plasma etching process. For example, there is proposed a technique for obtaining desired opening characteristics and selectivity by applying a DC voltage to the upper electrode in the capacitively coupled plasma etching apparatus (see, e.g., Patent Document 1).

Patent Document 1: Japanese Patent Application Publication No. 2008-21791

As described above, it is required to develop a technique capable of performing etching for forming a hole having a large depth in a desired shape in the plasma etching process.

SUMMARY OF THE INVENTION

In view of the above, the present invention provides a plasma etching method capable of performing etching for forming a hole having a large depth in a desired shape, a plasma etching apparatus and a computer-readable storage medium.

In accordance with an embodiment of the present invention, there is provided a plasma etching method for plasma-etching a silicon oxide film or a silicon nitride film formed below an amorphous carbon film by using a pattern of the amorphous carbon film as a final mask in a multilayer mask including a photoresist layer having a predetermined pattern, an organic bottom anti-reflection coating (BARC) film formed below the photoresist layer, an SiON film formed below the BARC film, and the amorphous carbon film formed below the SiON film.

An initial mask used at the time when the plasma etching of the silicon oxide film or the silicon nitride film is started is under a state in which the SiON film remains on the amorphous carbon film and a ratio of a film thickness of the amorphous carbon film to a film thickness of the residual SiON film is smaller than or equal to about 14.

In accordance with the present invention, it is possible to provide a plasma etching method capable of performing etching for forming a hole having a large depth in a desired shape, a plasma etching apparatus and a computer-readable storage medium.

BRIEF DESCRIPTION OF THE DRAWINGS

The objects and features of the present invention will become apparent from the following description of embodiments, given in conjunction with the accompanying drawings, in which:

FIGS. 3A and 3B are electron microscope images showing a state of a semiconductor wafer in a test example;

FIGS. 4A and 4B are electron microscope images showing a state of a semiconductor wafer in a comparative example;

FIGS. 6A to 6C are electron microscope images showing changes in a state of a photoresist due to application of a DC voltage.

DETAILED DESCRIPTION OF THE EMBODIMENT

Figure 1A:
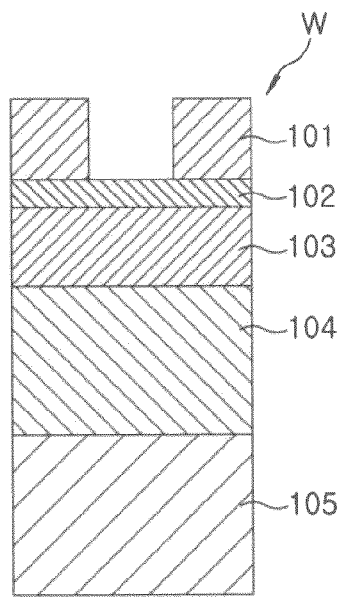
FIGS. 1A to 1D show cross sectional configurations of a semiconductor wafer in a plasma etching method in accordance with an embodiment of the present invention.
Figure 1B:
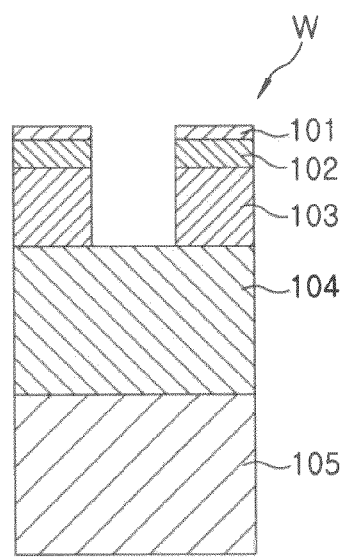

Embodiments of the present invention will be described with reference to the accompanying drawings which form a part hereof. FIGS. 1A to 1D show an enlarged view showing cross sectional configurations of a semiconductor wafer as a target substrate in a plasma etching method in accordance with an embodiment of the preset invention. FIG. 2 shows a configuration of a plasma etching apparatus in accordance with an embodiment of the present invention. First of all, the configuration of the plasma processing apparatus will be described with reference to FIG. 2.

The plasma etching apparatus includes an airtight processing chamber 1 that is electrically grounded. The processing chamber 1 is formed in a cylindrical shape and is made of, e.g., aluminum or the like. Provided in the processing chamber 1 is a mounting table 2 for horizontally supporting a semiconductor wafer W as a target substrate. The mounting table 2 is made of, e.g., aluminum or the like, and serves as a lower electrode. The mounting table 2 is supported by a conductive supporting table 4 provided via an insulating plate 3. Further, a focus ring 5 formed of, e.g., single crystalline silicon, is provided on an upper peripheral portion of the mounting table 2. Furthermore, a cylindrical inner wall member 3a made of, e.g., quartz or the like, is provided to surround the mounting table 2 and the supporting table 4.

The mounting table 2 is connected to a first RF (radio frequency) power supply 10a through a first matching unit 11a, and is connected to a second RF power supply 10b through a second matching unit 11b. The first RF power supply 10a is used for plasma generation, and a RF power of a predetermined frequency (about 27 MHz or higher, e.g., about 40 MHz) is supplied from the first RF power supply 10a to the mounting table 2. Further, the second RF power supply 10b is used for ion attraction (bias), and a RF power of a predetermined frequency (about 13.56 MHz or less, e.g., about 2 MHz) lower than that of the RF power from the first RF power supply 10a is supplied from the second RF power supply 10b to the mounting table 2. Meanwhile, a shower head 16 serving as an upper electrode is disposed above the mounting table 2 to face the mounting table 2 in parallel. The mounting table 2 and the shower head 16 serve as a pair of electrodes (upper electrode and lower electrode).

Provided on the top surface of the mounting table 2 is an electrostatic chuck 6 for electrostatically attracting and holding the semiconductor wafer W. The electrostatic chuck 6 is formed by embedding an electrode 6a in an insulator 6b, and the electrode 6a is connected to a DC power supply 12. Further, by applying a DC voltage from the DC power supply 12 to the electrode 6a, the semiconductor wafer W is attracted and held by a Coulomb force.

A coolant path 4a is formed inside the supporting table 4, and is connected to a coolant inlet line 4b and a coolant outlet line 4c. By circulating an appropriate coolant, e.g., cooling water or the like, through the coolant path 4a, the supporting table 4 and the mounting table 2 can be controlled at a predetermined temperature. Moreover, a backside gas supply line 30 for supplying a cold heat transfer gas (backside gas) to the backside of the semiconductor wafer W is provided to extend through the mounting table 2 and the like. The backside gas supply line 30 is connected to a backside gas supply source (not shown). With such configuration, the semiconductor wafer W electrostatically held on the top surface of the mounting table 2 by the electrostatic chuck 6 can be controlled to a predetermined temperature.

The shower head 16 is provided at an upper portion of the processing chamber 1. The shower head 16 has a main body 16a and an upper top plate 16b forming an electrode plate, and is supported at the upper portion of the processing chamber 1 via an insulation member 45. The main body 16a is made of a conductive material, e.g., aluminum having an anodically oxidized surface, and the upper top plate 16b is detachably held on the bottom of the main body 16a.

A gas diffusion space 16c is provided inside the main body 16a, and a plurality of gas holes 16d are formed in the bottom of the main body 16a so as to be positioned at the bottom of the gas diffusion space 16c. In addition, gas injection holes 16e are provided in the upper top plate 16b to extend through the upper top plate 16b in the thickness direction thereof and communicate with the respective gas holes 16d. With such configurations, a processing gas supplied to the gas diffusion space 16c is supplied and diffused in the processing chamber 1 in a shower shape through the gas holes 16d and the gas injection holes 16e. Besides, the main body 16a and the like are provided with lines (not shown) for circulating a coolant, so that the shower head 16 can be cooled to a desired temperature during the plasma etching process.

Formed in the main body 16a is a gas inlet port 16f for introducing a processing gas into the gas diffusion space 16c. The gas inlet port 16f is connected to one end of a gas supply line 15a, and the other end of the gas supply line 15a is connected to a processing gas supply source 15 for supplying a processing gas for etching or treatment. The gas supply line 15a is provided with a mass flow controller (MFC) 15b and an opening/closing valve V1 disposed thereon in that order from the upstream side. Further, the processing gas for plasma etching is supplied from the processing gas supply source 15 to the gas diffusion space 16c through the gas supply line 15a, and then is supplied to the processing chamber 1 in a shower shape through the gas holes 16d and the gas injection holes 16e.

A variable DC power supply 52 is electrically connected to the shower head 16 serving as the upper electrode via a low pass filter (LPF) 51. The power supply of the variable DC power supply 52 can be on-off controlled by an on/off switch 53. A current and a voltage of the variable DC power supply 52 and an on/off operation of the on/off switch 53 are controlled by a control unit 60 to be described later. As will be described later, when a plasma is generated in a processing space by applying the RF powers from the first RF power supply 10a and the second RF power supply 10b to the mounting table 2, the on/off switch 53 is turned on by the control unit 60 if necessary, and a predetermined negative DC voltage, for example, is applied to the shower head 16 serving as the upper electrode.

A cylindrical ground conductor 1a extends upward from the sidewall of the processing chamber 1 so as to be located at a position higher than the height position of the shower head 16. The cylindrical ground conductor 1a has a ceiling wall at the top thereof.

A gas exhaust port 71 is formed at the bottom of the processing chamber 1, and a gas exhaust unit 73 is connected to the gas exhaust port 71. By operating a vacuum pump provided in the gas exhaust unit 73, the inside of the processing chamber 1 can be depressurized to a predetermined vacuum level. Meanwhile, a loading/unloading port 74 for the wafer W is provided at a sidewall of the processing chamber 1, and a gate valve 75 for opening or closing the loading/unloading port 74 is provided at the loading/unloading port 74.

Reference numerals 76 and 77 in the drawing denote deposition shield members that are detachably installed. The deposition shield member 76 is provided along the inner wall surface of the processing chamber 1, and prevents etching by-products (deposits) from being attached to the processing chamber 1. A conductive port (GND block) 79 DC-connected to the ground is provided to a portion of the deposition shield member 76 at a height position substantially same as the height of the semiconductor wafer W. Accordingly, an abnormal discharge can be prevented.

The operation of the plasma etching apparatus configured as described above is generally controlled by a control unit 60. The control unit 60 has a process controller 61 which has a CPU and controls each unit of the plasma etching apparatus, a user interface 62 and a storage unit 63.

The user interface 62 includes a keyboard for a process manager to input commands to operate the plasma etching apparatus, a display for visualizing an operational status of the plasma etching apparatus, and the like.

The storage unit 63 stores therein recipes including a control program (software), processing condition data and the like for realizing various processes performed by the plasma etching apparatus under the control of the process controller 61. Moreover, when a command is received from the user interface 62, a necessary recipe is retrieved from the storage unit 63 and executed by the process controller 61, so that a desired process is performed by the plasma etching apparatus under the control of the process controller 61. Further, the recipes including the control program, the processing condition data and the like can be stored in a computer-readable storage medium (for example, a hard disk, a CD, a flexible disk, a semiconductor memory, or the like) or can be transmitted on-line, when needed, from another apparatus, via, e.g., a dedicated line.

Hereinafter, there will be described a process sequence of plasma-etching a silicon oxide film or a silicon nitride film, an amorphous carbon film, a SiON film, an organic bottom anti-reflection coating (BARC) film and the like formed on the semiconductor wafer W, which is performed by the plasma etching apparatus configured as described above. First, the gate valve 75 is opened, and the semiconductor wafer W is loaded through the loading/unloading port 74 into the processing chamber 1 by a transfer robot (not shown) or the like from a load lock chamber (not shown), and then is mounted on the mounting table 2. Thereafter, the transfer robot is retreated from the processing chamber 1, and the gate valve 75 is closed. Then, the processing chamber 1 is evacuated by the vacuum pump of the gas exhaust unit 73 through the gas exhaust port 71.

After the inside of the processing chamber 1 reaches a predetermined vacuum level, a predetermined processing gas (etching gas) is introduced from the processing gas supply source 15 into the processing chamber 1, and the inside of the processing chamber 1 is maintained at a predetermined pressure level. In this state, a RF power having a frequency of, e.g., about 40 MHz, is supplied from the first RF power supply 10a to the mounting table 2. Further, a RF power having a frequency of, e.g., about 3 MHz, for ion attraction is supplied from the second RF power supply 10b to the mounting table 2. At this time, a predetermined DC voltage is applied from the DC power supply 12 to the electrode 6a of the electrostatic chuck 6, and the semiconductor wafer W is electrostatically attracted and held on the electrostatic chuck 6 by a Coulomb force.

In this case, due to the application of the RF powers to the mounting table 2 serving as the lower electrode as described above, an electric field is formed between the shower head 16 serving as the upper electrode and the mounting table 2 serving as the lower electrode. A discharge is generated in a processing space in which the semiconductor wafer W exists, and the silicon oxide film or the silicon nitride film, the amorphous carbon film, the SiON film, the organic bottom anti-reflection coating (BARC) film and the like formed on the semiconductor wafer W are etched by the plasma of the processing gas which is generated by the discharge.

Since a DC voltage can be applied to the shower head during the plasma process as described above, the following effects are obtained.

Depending on a process involved, a plasma having a high electron density and a low ion energy may be required. If a DC voltage is used in that case, energy of ions striking the semiconductor wafer W is suppressed, and the electron density of the plasma is increased. As a consequence, an etching rate of an etching target film formed on the semiconductor wafer W is increased, and a sputtering rate of a film serving as a mask formed on the etching target film is reduced, which results in improvement of selectivity. Further, the photoresist layer is hardened, so that the residual amount of the photoresist layer can be increased.

Upon the completion of the etching process, the supply of the RF powers, the supply of the DC voltage and the supply of the processing gas are stopped, and the semiconductor wafer W is unloaded from the processing chamber 1 in the reverse sequence as described above.

Hereinafter, a plasma etching method in accordance with an embodiment of the present invention will be described with reference to FIGS. 1A to 1D. FIGS. 1A to 1D are enlarged views showing cross sectional configurations of principal parts of a semiconductor wafer W as a target substrate in the present embodiment. As shown in FIG. 1A, a photoresist layer 101 patterned in a predetermined shape, i.e., a photoresist layer 101 having holes formed at predetermined positions, is formed as an uppermost layer of the semiconductor wafer W.

An organic bottom anti-reflection coating (BARC) film 102 is formed below the photoresist layer 101; a SiON film 103 is formed below the organic BARC film 102; and an amorphous carbon film 104 is formed below the SiON film 103.

A silicon oxide film (or a silicon nitride film) 105 as an etching target film is formed below the amorphous carbon film 104. The photoresist layer 101, the organic BARC film 102, the SiON film 103 and the amorphous carbon film 104 which are formed above the silicon oxide film 105 form a multilayer mask.

The semiconductor wafer W having the above-described structure is accommodated in the processing chamber 1 of the plasma etching apparatus shown in FIG. 2 and then is mounted on the mounting table 2. First of all, the organic BARC film 102 and the SiON film 103 are etched by using the photoresist layer 101 as an initial mask from the state shown in FIG. 1A, thereby obtaining a state shown in FIG. 1B. At this time, it is preferable that the residual amount (film thickness) of the photoresist layer 101 exceeds a certain level.

Figure 1C:
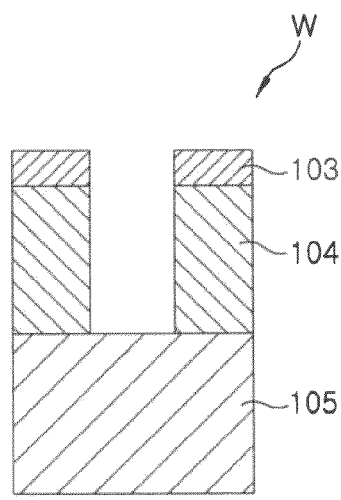
Figure 2:
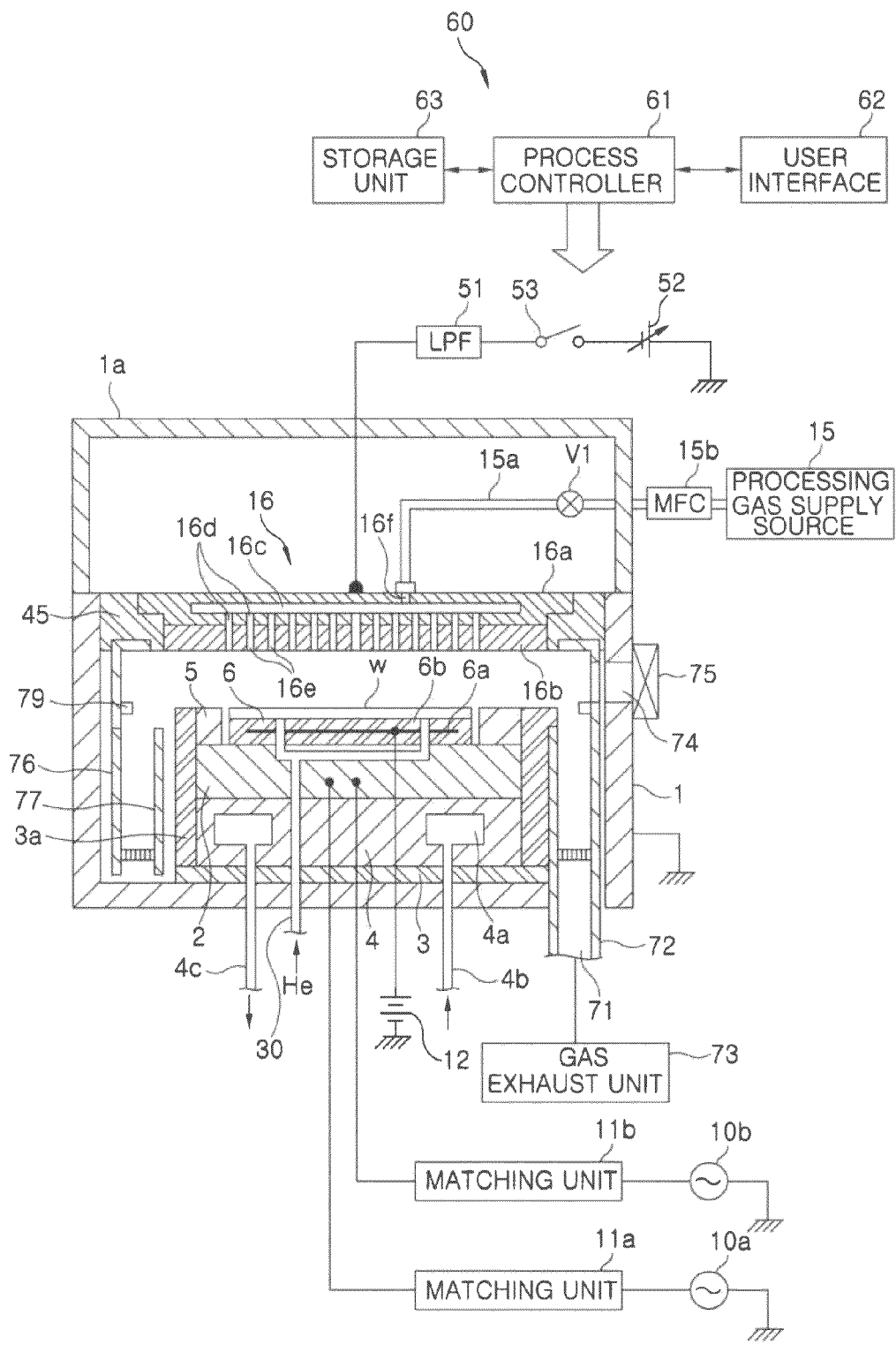
FIG. 2 shows a schematic configuration of a plasma etching apparatus in accordance with an embodiment of the present invention.

Next, the amorphous carbon film 104 is etched by using the residual photoresist layer 101 and the etched organic BARC film 102 and the etched SiON film 103 as a mask, thereby obtaining a state shown in FIG. 1C. Finally, the silicon oxide film (or the silicon nitride film) 105 is etched by using the amorphous carbon film 104 as a mask. The silicon oxide film (or the silicon nitride film) 105 has a thickness of about 2500 nm or above. In this embodiment, the thickness thereof is about 2600 nm.

FIG. 1C shows a state of the initial mask used at the time when the etching of the silicon oxide film 105 is started. The initial mask is under a state in which the SiON film 103 remains on the amorphous carbon film 104 (having a thickness of about 850 nm in the present embodiment).

In the present embodiment, the ratio of the film thickness of the amorphous carbon film 104 to the film thickness of the residual SiON film 103 is set as follow:

Film thickness of the amorphous carbon film 104/Film thickness of the residual SiON film ≤14, and preferably Film thickness of the amorphous carbon film 104/Film thickness of the residual SiON film ≤13.6.

Figure 1D:
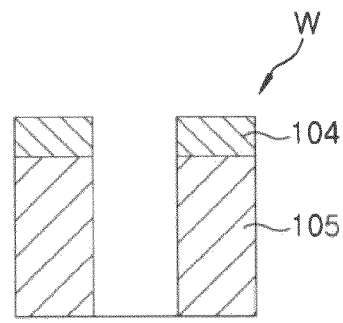

In other words, the initial mask used at the time when the etching of the silicon oxide film 105 is started in the present embodiment includes the amorphous carbon film 104 having a thickness of about 850 nm and the residual SiON film having a thickness of about 60.0 nm or above, preferably about 62.5 nm or above, which remains on the amorphous carbon film 104. Accordingly, as shown in FIG. 1D, a film thickness (residual amount) of the amorphous carbon film 104 remaining after the completion of the etching of the silicon oxide film 105 can be increased, and the silicon oxide film 105 can be etched in a desired shape.

FIGS. 3A and 3B provide electron microscope images showing the states of the wafer at the time when the etching of the silicon oxide film 105 is completed in a test example, wherein FIG. 3A shows a central portion of the wafer, and FIG. 2B shows a peripheral portion of the wafer. The lower electron microscope image is an enlarged view around openings shown in the upper electron microscope image.

In the test example, in the initial mask used at the time when the etching of the silicon oxide film 105 is started, the ratio of the film thickness of the amorphous carbon film 104 to the film thickness (residual amount in thickness) of the residual SiON film 103 is about 13.6. In this case, the film thickness (residual amount) of the amorphous carbon film 104 in FIG. 3A is about 645 nm, and the film thickness (residual amount) of the amorphous carbon film 104 in FIG. 3B is about 600 nm. If the film thickness (residual amount) of the amorphous carbon film 104 remaining on the silicon oxide film 105 at the time when the etching is completed is increased, the hole in the silicon oxide film 105 has a substantially vertical shape, which can prevent the occurrence of bowing or the like. Moreover, the ratio of the film thickness of the amorphous carbon film 104 to the film thickness (residual amount in thickness) of the residual SiON film 103 is preferably about 14 or less.

FIGS. 4A and 4B provide electron microscope images showing the state of the wafer at the time when the etching of the silicon oxide film 105 is completed in a comparative example, wherein FIG. 4A shows a central portion of the wafer, and FIG. 4B shows a peripheral portion of the wafer. The lower electron microscope image is an enlarged view around openings shown in the upper electron microscope image.

In the comparative example, in the initial mask used at the time when the etching of the silicon oxide film 105 is started, the ratio of the film thickness of the amorphous carbon film 104 to the film thickness of the residual SiON film 103 is about 17. In this case, the film thickness (residual amount) of the amorphous carbon film 104 in FIG. 4A is about 595 nm, and the film thickness (residual amount) of the amorphous carbon film 104 in FIG. 4B is about 545 nm. As described above, in the comparative example, the film thickness (residual amount) of the amorphous carbon film 104 is smaller than about 600 nm, which is smaller than that in the test example, so that bowing occurred in the hole of the silicon oxide film 105.

Figure 5:
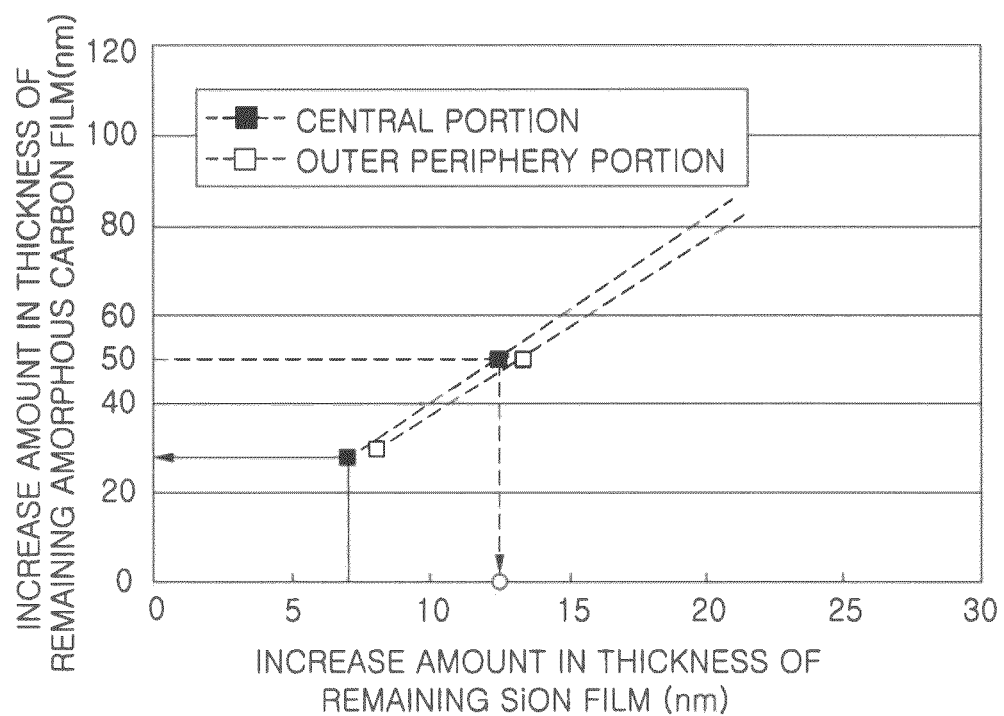
FIG. 5 is a graph showing relationship between a residual amount of a SiON film and a residual amount of an amorphous carbon film.

The residual amount of the amorphous carbon film 104 in the test example and that in the comparative example have a difference of about 50 nm. FIG. 5 shows relationship between the increased amount in thickness of the residual amorphous carbon film and the increased amount in thickness of the residual SiON film 103 in the initial mask at the time when the etching of the silicon oxide film 105 is started. As shown in FIG. 5, the film thickness (residual amount) of the SiON film in the initial mask needs to be increased by about 10 to 15 nm in order to increase the film thickness of the amorphous carbon film 104 by about 40 to 60 nm.

In the above test example, the plasma etching was performed in accordance with the following recipes. These recipes are read out from the storage unit 63 of the control unit 60 and sent to the process controller 61. The process controller 61 controls each unit of the plasma etching apparatus based on the control program, thereby performing the plasma etching process in accordance with the read-out recipes.

(Etching of the Organic BARC Film 102 and the SiON Film 103)
Processing gas: $CF_4/CHF_3/C_4F_8/O_2$=240/60/10/10 sccm
Pressure: 16.0 Pa (120 mTorr)
DC voltage: −1100 V (The applied DC voltage ranges from about −400 V to about −1100 V in accordance with the condition of the applied RF power.)
RF power (HF/LF): 300/300 W
Temperature (upper/sidewall/lower): 95/60/0° C.
Time: 80 sec (Etching of the Amorphous Carbon Film 104)
Processing gas: $O_2/COS$=740/5 sccm
Pressure: 2.66 Pa (20 mTorr)
RF power (HF/LF): 2800/3000 W
Temperature (upper/sidewall/lower): 95/60/0° C.
Time: 40 sec (Etching of the Silicon Oxide Film 105)
Processing gas: $C_4F_8/Ar/O_2$=60/450/59 sccm
Pressure: 2.66 Pa (20 mTorr)
RF power (HF/LF): 2000/4500 W
DC voltage: −1100V
Temperature (upper/sidewall/lower): 95/60/0° C.
Time: 2 min and 30 sec When the organic BARC film 102 and the SiON film 103 are etched, the RF power is reduced to about 300 W/300 W, and the flow rate of $O_2$ gas is reduced to about 10 sccm. Accordingly, the etch selectivity to the photoresist layer 101 can be improved, and the residual amount of the SiON film 103 at the time when the etching of the amorphous carbon film 104 is completed can be increased to about 60 nm or above. Further, when the RF power was set to, e.g., about 1500 W/1500 W, and the flow rate of $O_2$ gas was set to about 30 sccm, the residual amount of the SiON film 103 was reduced to about 55 nm.

In addition, when the organic BARC film 102 and the SiON film 103 are etched, it is preferable to apply a DC voltage to the upper electrode. If the etching is performed while applying a DC voltage to the upper electrode, the photoresist layer 102 is hardened and, thus, the residual amount thereof can be increased. This becomes more effective when the gap between the upper electrode and the lower electrode (mounting table) is reduced to, e.g., about 30 mm. For that reason, it is preferable to apply a DC voltage to the upper electrode in a state where the gap between the upper electrode and the lower electrode (mounting table) is reduced.

FIGS. 6A to 6C provide electron microscope images showing relationship between the residual amount of the mask and the application of a DC voltage to the upper electrode in case of etching a silicon oxide film. The electron microscope image of FIG. 6A shows a case in which a DC voltage of about −1050 V is applied; that of FIG. 6B shows a case in which a DC voltage of about −600 V is applied; and that of FIG. 6C shows a case in which no DC voltage is applied. In FIGS. 6A to 6C, the upper electron microscope images illustrate the states of the top surface of the semiconductor wafer, and the lower electron microscope images illustrate the vertical cross sectional configuration of the semiconductor wafer.

As shown in FIGS. 6A to 6C, when a DC voltage of about −600 V and that of about −1050 V are applied to the upper electrode, the residual amount of the mask can be improved by about 60 nm and about 83 nm, respectively, compared to when no DC voltage was applied. Although the example shown in FIGS. 6A to 6C shows the case of etching the silicon oxide film, the same result can be obtained in the case of etching the organic BARC film or the like by using a carbon fluoride etching gas.

The following etching conditions are applied to the example of FIG. 6.
Processing gas: $C_4F_8/C_4F_6/C_3F_8/Ar/O_2$=37/5/28/450/59 sccm
Pressure: 3.99 Pa (30 mTorr)
RF power (HF/LF): 1500/4500 W
Time: 60 sec In general, the organic BARC film is etched by using an etching gas containing a large amount of oxygen. When a DC voltage is applied to the upper electrode while the etching gas containing a large amount of oxygen is used, oxygen in the etching gas reacts with silicon of the upper electrode, thereby forming a silicon oxide film. Since the silicon oxide film is an insulating film, the function of the upper electrode deteriorates. By reducing the amount of oxygen in the etching gas, however, the formation of the silicon oxide film can be suppressed even when a DC voltage is applied.

Meanwhile, the amorphous carbon film 104 that is an organic film is etched without applying a DC voltage to the upper electrode. When the amorphous carbon film 104 is etched, the photoresist layer 101 and the organic BARC film 102 are also etched. Therefore, the amorphous carbon film 104 is etched by using the SiON film 103 as a mask. However, by increasing the residual amount of the photoresist layer 101 during the etching of the organic BARC film 102 and the SiON film 103, the residual amount of the SiON film 103 can be increased. Further, when the amorphous carbon film 104 is etched, the residual amount of the SiON film 103 upon completing the etching of the amorphous carbon film 104 can be increased by increasing a pressure to, e.g., about 6.65 Pa (50 mTorr).

When the silicon oxide film 105 is etched, it is preferable to apply a DC voltage to the upper electrode. Further, generally, the silicon oxide film 105 is etched by using a processing gas generating large amount of deposits to obtain a high selectivity of the silicon oxide film 105 against the amorphous carbon film 104. However, in the present embodiment, the initial mask in which the SiON film 103 having a large thickness remains on the amorphous carbon film 104 is used, so that the etching can be performed under the condition in which deposits are reduced. Hence, a hole having a desired shape can be formed while improving an etching profile.

When a hole having a large depth is formed, bottom distortion in which a shape of a bottom portion of the hole is distorted may occur. In this case, the bottom distortion can be prevented by setting a temperature of the mounting table (lower electrode) for mounting thereon a semiconductor wafer W to about 40° C.

As described above, in accordance with the present embodiment and the test example, even a hole having a large depth can be etched in a desired shape while preventing the occurrence of bowing or the like.

While the invention has been shown and described with respect to the embodiment or test example, it will be understood by those skilled in the art that various changes and modification may be made without departing from the scope of the invention as defined in the following claims.

What is claimed is:

1. A plasma etching method comprising:
   preparing a substrate having a photoresist layer of a predetermined pattern, an organic bottom anti-reflection coating (BARC) film formed below the photoresist layer, an SiON film formed below the BARC film, and an amorphous carbon film formed below the SiON film, and a silicon oxide film or a silicon nitride film formed below the amorphous carbon film;
   a first etching step of etching the BARC film and the SiON film by using the photoresist layer as a mask, wherein a part of the photoresist layer remains on the BARC film after the first etching step;
   a second etching step of etching the amorphous carbon film by using the remaining photoresist layer, the BARC film and the SiON film as a mask, wherein a part of the SiON film remains after the second etching step and a ratio of a film thickness of the amorphous carbon film to a film thickness of the remaining SiON film is equal to or smaller than about 14; and
   a third etching step of etching the silicon oxide film or the silicon nitride film by using the remaining SiON film and the amorphous carbon film as a mask,
   wherein at least the first etching step and the second etching step are performed using a plasma etching apparatus that includes a lower electrode provided in a processing chamber for mounting the substrate thereon, an upper electrode provided in the processing chamber to face the lower electrode, and a RF power supply for applying a RF power between the lower electrode and the upper electrode,
   wherein a DC voltage is applied to the upper electrode while the BARC film and the SiON film are etched in the first etching step and wherein no DC voltage is applied to the upper electrode while the amorphous carbon film is etched in the second etching step.

2. The plasma etching method of claim 1, wherein the silicon oxide film or the silicon nitride film has a film thickness of about 2500 nm or above.

3. The plasma etching method of claim 1, wherein the first etching step, the second etching step, and the third etching step are performed by using a first processing gas, a second processing gas, and a third processing gas, respectively, that each includes oxygen gas, and
   wherein a concentration of the oxygen gas in the first processing gas is smaller than that in each of the second processing gas and the third processing gas.

4. The plasma etching method of claim 1, wherein, in the second etching step, the amorphous carbon film is etched by reducing a pressure level compared to that in the first etching step.

5. The plasma etching method of claim 1, wherein, in the third etching step, the silicon oxide film or the silicon nitride film is etched by using a processing gas which generates a small amount of deposits.

6. The plasma etching method of claim 1, wherein the silicon oxide film or the silicon nitride film are etched while a DC voltage is applied to the upper electrode in the third etching step.

7. A plasma etching method comprising:
   preparing a substrate having a photoresist layer of a predetermined pattern, an organic bottom anti-reflection coating (BARC) film formed below the photoresist layer, an SiON film formed below the BARC film, an amorphous carbon film formed below the SiON film, and a silicon oxide film or a silicon nitride film formed below the amorphous carbon film;
   a first etching step of etching the BARC film and the SiON film by using the photoresist layer as a mask, wherein a part of the photoresist layer remains on the BARC film after the first etching step;
   a second etching step of etching the amorphous carbon film by using the remaining photoresist layer, the BARC film and the SiON film as a mask, wherein a part of the SiON film remains after the second etching step; and
   a third etching step of etching the silicon oxide film or the silicon nitride film by using the remaining SiON film and the amorphous carbon film as a mask,
   wherein at least the first etching step and the second etching step are performed using a plasma etching apparatus that includes a lower electrode provided in a processing chamber for mounting the substrate thereon, an upper electrode provided in the processing chamber to face the lower electrode, and a RF power supply for applying a RF power between the lower electrode and the upper electrode, and
   wherein a DC voltage is applied to the upper electrode while the BARC film and the SiON film are etched in the first etching step and wherein no DC voltage is applied to the upper electrode while the amorphous carbon film is etched in the second etching step.

8. The plasma etching method of claim 7 wherein the silicon oxide film or the silicon nitride film has a film thickness of about 2500 nm or above.

9. The plasma etching method of claim 7 wherein the first etching step, the second etching step, and the third etching step are performed by using a first processing gas, a second processing gas, and a third processing gas, respectively, that each includes oxygen gas, and wherein a concentration of the oxygen gas in the first processing gas is smaller than that in each of the second processing gas and the third processing gas.

10. The plasma etching method of claim 7 wherein, in the second etching step, the amorphous carbon film is etched by reducing a pressure level compared to that in the first etching step.

11. The plasma etching method of claim 7 wherein, in the third etching step, the silicon oxide film or the silicon nitride film is etched by using a processing gas which generates a small amount of deposits.

12. The plasma etching method of claim 7 wherein the silicon oxide film or the silicon nitride film are etched while a DC voltage is applied to the upper electrode in the third etching step.

* * * * *